United States Patent
Kumar

(10) Patent No.: US 6,762,631 B1
(45) Date of Patent: Jul. 13, 2004

(54) LOCK DETECTION CIRCUIT FOR A PHASE LOCKED LOOP CIRCUIT

(75) Inventor: Ravi Kumar, Bangalore (IN)

(73) Assignee: National Semiconductor Corporation, Santa Clara, CA (US)

( * ) Notice: Subject to any disclaimer, the term of this patent is extended or adjusted under 35 U.S.C. 154(b) by 12 days.

(21) Appl. No.: 09/992,950

(22) Filed: Nov. 6, 2001

(51) Int. Cl.$^7$ ................................................ H03L 7/00
(52) U.S. Cl. .................... 327/142; 331/DIG. 2
(58) Field of Search ................................ 327/142, 146, 327/12, 147, 150, 151, 155, 160; 331/DIG. 2; 375/373; 377/104, 105

(56) References Cited

U.S. PATENT DOCUMENTS

| | | | | |
|---|---|---|---|---|
| 4,575,684 A | * | 3/1986 | Stamm | ........................ 329/307 |
| 4,617,520 A | * | 10/1986 | Levine | ......................... 327/12 |
| 5,304,952 A | * | 4/1994 | Quiet et al. | .................. 331/1 A |
| 5,969,576 A | * | 10/1999 | Trodden | ...................... 331/1 A |

* cited by examiner

*Primary Examiner*—Linh M. Nguyen

(57) ABSTRACT

A lock detection circuit is disclosed that is capable of detecting when a phase locked loop circuit is in a locked or unlocked condition. The invention comprises an exclusive OR gate, a deglitch unit, a gate circuit, a count lock circuit, a count unlock circuit, and a flip flop circuit. The deglitch unit outputs a clear "clr" signal only when UP signals and DN signals from a phase frequency detector in the phase locked loop circuit are mismatched in time by more than a predetermined period of time. Detection of a locked condition or an unlocked condition is made by processing "clr" signals in the count lock circuit and in the count unlock circuit.

30 Claims, 5 Drawing Sheets

LOCK DETECTION CIRCUIT FOR A PHASE LOCKED LOOP CIRCUIT

CROSS-REFERENCE TO RELATED APPLICATIONS

The present invention is related to those disclosed in the following United States Non-Provisional Patent Applications:

1) Ser. No. 09/992,000, filed concurrently herewith, entitled "PHASE-LOCKED LOOP FREQUENCY SYNTHESIZER USING AUTOMATIC LOOP CONTROL AND METHOD OF OPERATION"; and
2) Ser. No. 09/993,283, filed concurrently herewith, entitled "CHARGE PUMP CIRCUIT FOR A HIGH SPEED PHASE LOCKED LOOP".

The above patent applications are commonly assigned to the assignee of the present invention. The disclosures of these related patent applications are hereby incorporated by reference for all purposes as if fully set forth herein.

FIELD OF THE INVENTION

The present invention relates generally to the field of integrated circuit technology. The present invention provides an improved lock detection circuit that indicates when an output phase is locked to an input phase in a phase locked loop circuit.

BACKGROUND OF THE INVENTION

Phase locked loop circuits are well known. FIG. 1 illustrates a block diagram of a prior art frequency synthesizer charge pump phase locked loop (PLL) circuit 100. Input signal FIN is provided to input divider 110 and the output of input provider 110 is provided to a first input of phase frequency detector 120. Phase frequency detector 120 provides an "up" signal (designated "UP") and a "down" signal (designated "DN") to charge pump 130. As is well known in the art, the UP signal closes a switch to cause current source 140 to provide current $I_{up}$ to the output line of charge pump 130. The DN signal closes a switch to cause current source 150 to draw current $I_{DN}$ from the output line of charge pump 130.

The output line of charge pump 130 is coupled to loop filter 160 and to voltage controlled oscillator 170. The currents from charge pump 130 adjust the phase of the voltage controlled oscillator 170. The output signal For from voltage controlled oscillator 170 is provided to feedback divider 180. The output of feedback divider 180 is provided to a second input of phase frequency detector 120.

A charge pump PLL is a negative feedback system that insures that the phase difference as well as the frequency difference at the input of phase frequency detector 120 is near zero under steady state conditions. A PLL in such a state is said to be in a "lock" condition or "locked." The input and output frequencies are related by a fixed ratio which can be selected by choosing the values of the input divider 110 and the feedback frequency divider 180.

A charge pump PLL is typically a second order system. Therefore, any change from the steady state condition will result in a transient response that is typically characterized by the damping factor and the natural frequency of the system. The damping factor and the natural frequency of the system are dependent upon physical quantities such as the charge pump current, the effective gain of the voltage controlled oscillator 170, parameters of the loop filter 160, and properties of the phase frequency detector 120. The settling behavior of the transient response may also be governed by the comparison frequency at the input of the phase frequency detector 120.

Because some of these parameters are not constant, the time required for the PLL to acquire lock will vary. The output frequency of the PLL before it acquires lock is not stable and should therefore not be used. Because the charge pump PLL is second order system, there will be some overshoots and some undershoots in the transient response signal.

A lock detection circuit can be constructed that is capable of indicating the locked or unlocked state of the PLL circuit. Various methods exist for implementing a lock detection circuit. The implementation may be either analog or digital. Most prior art implementations rely on monitoring the activity at the output of the phase frequency detector 120 and some sort of analog filtering. For a lock detection signal to be of practical use, the signal should remain stable, should be insensitive to various mismatches in the loop, and should be tolerant to noise, and should have minimum latency.

The output of a Type IV phase frequency detector in a charge pump PLL comprises pulses at the UP output pin and at the DN output pin such that the difference in the pulse widths of the UP signal and the DN signal is equal to the input phase difference. The UP and DN signals are provided to charge pump 130. In response, charge pump 130 dumps an equivalent charge to adjust the phase of the voltage controlled oscillator 170. In a locked state, the output of phase frequency detector 120 comprises narrow pulses of equal duration on the UP output pin and on the DN output pin. The use of narrow pulses even in the locked state prevents the formation of a dead zone for small phase differences at the input of phase frequency detector 120.

There are deviations from ideal behavior in a practical system. For example, the "up" current $I_{up}$ and the "down" current $I_{DN}$ in charge pump 130 are not exactly equal due to the finite output impedance of current source 140 and current source 150. There can also be delay mismatches between the UP signal and the DN signal at the output of phase frequency detector 120. Leakage in loop filter 160 may also affect the operation of the charge pump PLL system.

Because the charge pump PLL system is a negative feedback system, the PLL corrects for all the non-ideal conditions by having a small phase offset at the input of the phase frequency detector 120 of an appropriate magnitude and polarity to negate these effects. This phase difference at the input of the phase frequency detector 120 is called the "static phase error."

Random noise from individual components within the PLL circuit or from the power supply (not shown) could lead to an occasional pulse (or pulses) at the output of the phase frequency detector 120. An occurrence of such a pulse (or pulses) does not technically amount to an unlocked condition. Unless proper care is taken in designing a lock detection circuit, such a pulse (or pulses) may appear as an erroneous signal or glitch in the "lock" signal.

It would be desirable to have a lock detection circuit in a phase locked loop circuit that is capable of detecting when an output phase is locked and is not locked to an input phase in the phase locked loop circuit.

It would also be desirable to have a lock detection circuit in a phase locked loop circuit that is capable of generating a lock signal that is stable.

It would also be desirable to have a lock detection circuit in a phase locked loop circuit that is capable of generating a lock signal that is insensitive to mismatches within individual circuit elements within the phase locked loop circuit.

It would also be desirable to have a lock detection circuit in a phase locked loop circuit that is tolerant of noise and that has minimum latency.

SUMMARY OF THE INVENTION

The present invention is directed to an apparatus and method for providing a lock detection circuit in a phase locked loop circuit that is capable of detecting when an output phase is locked to an input phase in the phase locked loop circuit, and when an output phase is not locked to an input phase in the phase locked loop circuit.

An advantageous embodiment of the present invention comprises an exclusive OR gate, a deglitch unit, a gate circuit, a count lock circuit, a count unlock circuit, and a D flip flop circuit. The exclusive OR gate receives an UP signal and a DN signal from a phase frequency detector. The exclusive OR gate filters out those portions of an UP signal and those portions of a DN signal that occur at the same time. The output of the exclusive OR gate represents either (1) a portion of an UP signal that occurs when a DN signal is not present, or (2) a portion of a DN signal that occurs when an UP signal is not present.

The deglitch unit outputs a clear "clr" signal pulse only when the UP and DN signals are mismatched in time by more than a predetermined period of time. The delay time is equal to (or slightly greater than) the estimated static phase error of the PLL when it is locked.

The detection of a locked or an unlocked state within the PLL is made by processing "dclr" 1 signal pulses. The "clr" signal pulses are coupled to a first input of gate circuit and also are coupled to a count unlock circuit. When the PLL is not in a locked condition, the gate circuit passes each "clr" signal pulse to a count lock circuit to reset a counter within the count lock circuit that is counting clock cycles. In the absence of a "clr" signal pulse for a fixed number of clock cycles, the count lock circuit determines that the PLL is locked. The count lock circuit then outputs a ready "rdy" signal to a D flip flop that sets a "lock" signal. The "lock" signal is coupled to a second input of the gate circuit.

After the PLL is in a locked condition, the lock detection circuit of the present invention looks for an unlocked condition. The gate circuit blocks any "clr" signal pulses from resetting the counter in the count lock circuit. The count lock circuit now counts clock cycles and outputs a reset "rst" signal pulse to the count unlock circuit after the count lock circuit counts a predetermined number of clock cycles.

The count unlock circuit counts the number of "clr" signal pulses received from the deglitch unit between two "rst" signal pulses received from the count lock circuit. When the number of "clr" signal pulses received exceeds a predetermined number between two "rst" signal pulses, the count unlock circuit then outputs an "unlock" signal to clear the D flip flop. This causes the "lock" signal to go low indicating that the PLL is in an unlocked condition.

The lock detection circuit of the present invention operates by cycling back and forth between searching for the occurrence of an unlocked condition when the PLL is locked, and searching for the occurrence of a locked condition when the PLL is unlocked.

It is an object of the present invention to provide an apparatus and method for providing a lock detection circuit for a phase locked loop circuit that is capable of generating a lock signal that is stable.

It is another object of the present invention to provide an apparatus and method for providing a lock detection circuit for a phase locked loop circuit that is capable of generating a lock signal that is insensitive to mismatches within individual circuit elements within the phase locked loop circuit.

It is also an object of the present invention to provide an apparatus and method for providing a lock detection circuit for a phase locked loop circuit that is tolerant of noise and that has minimum latency.

It is another object of the present invention to provide an apparatus and method for providing a lock detection circuit for a phase locked loop circuit that is capable of ignoring one or more pairs of occasionally mismatched UP signals and DN signals from a phase frequency detector when the phase locked loop circuit is in a locked condition.

The foregoing has outlined rather broadly the features and technical advantages of the present invention so that those skilled in the art may better understand the Detailed Description of the Invention that follows. Additional features and advantages of the invention will be described hereinafter that form the subject matter of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention, it may be advantageous to set forth definitions of certain words and phrases used throughout this patent document: The terms "include" and "comprise" and derivatives thereof, mean inclusion without limitation, the term "or" is inclusive, meaning "and/or"; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, to bound to or with, have, have a property of, or the like; and the term "controller," "processor," or "apparatus" means any device, system or part thereof that controls at least one operation. Such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document. Those of ordinary skill should understand that in many instances (if not in most instances), such definitions apply to prior, as well as future uses of such defined words and phrases.

BRIEF DESCRIPTION OF THE DRAWINGS

For a more complete understanding of the present invention, and the advantages thereof, reference is now made to the following descriptions taking in conjunction with the accompanying drawings, wherein like numbers designate like objects, and in which.

DETAILED DESCRIPTION OF THE INVENTION

FIGS. 1 through 8, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase locked loop system.

Figure 1:
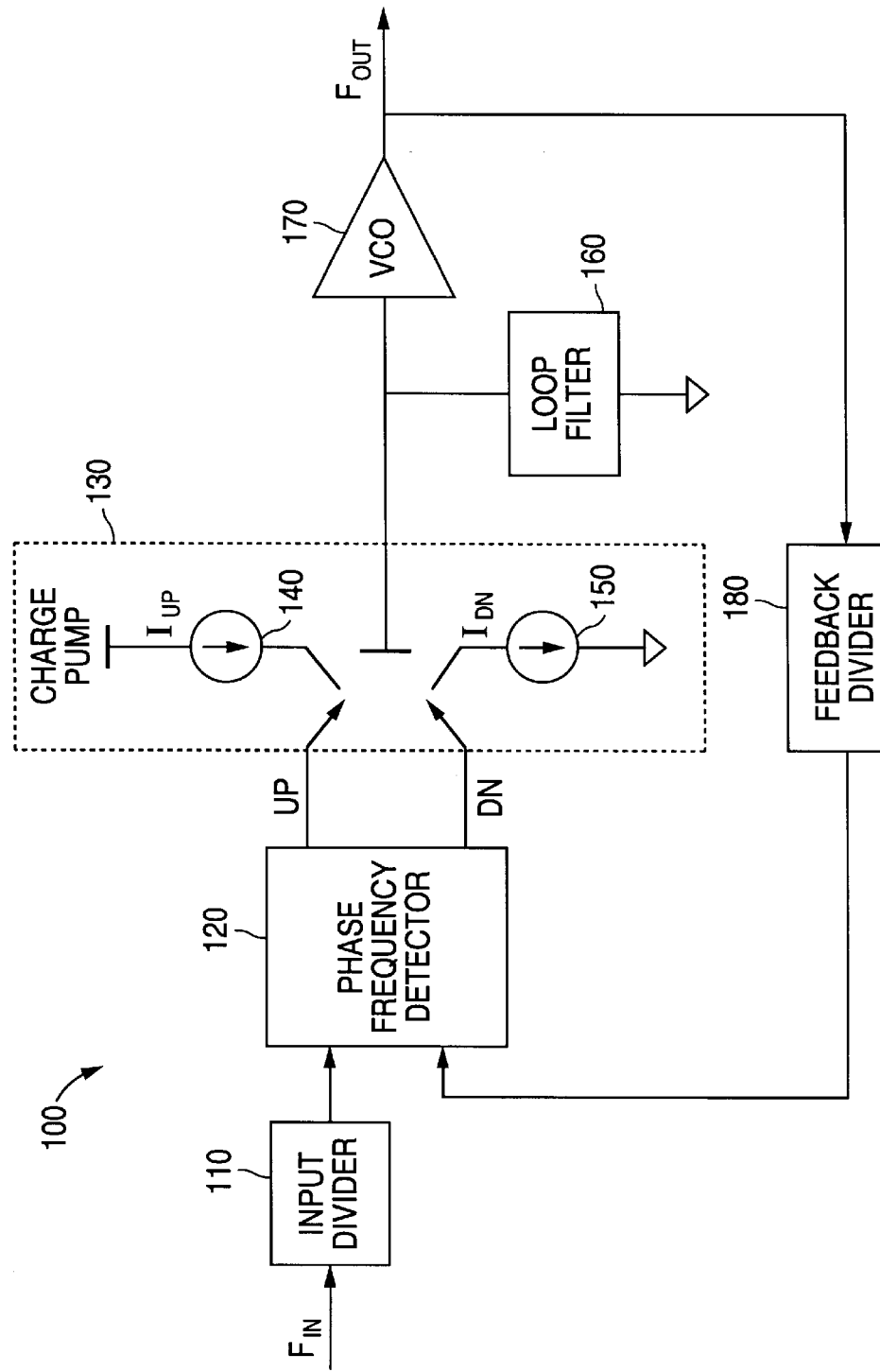
FIG. 1 illustrates a block diagram of a prior art frequency synthesizer charge pump phase locked loop (PLL) circuit.

As previously described, FIG. 1 illustrates a block diagram of a prior art frequency synthesizer charge pump phase locked loop (PLL) circuit.

Figure 2:
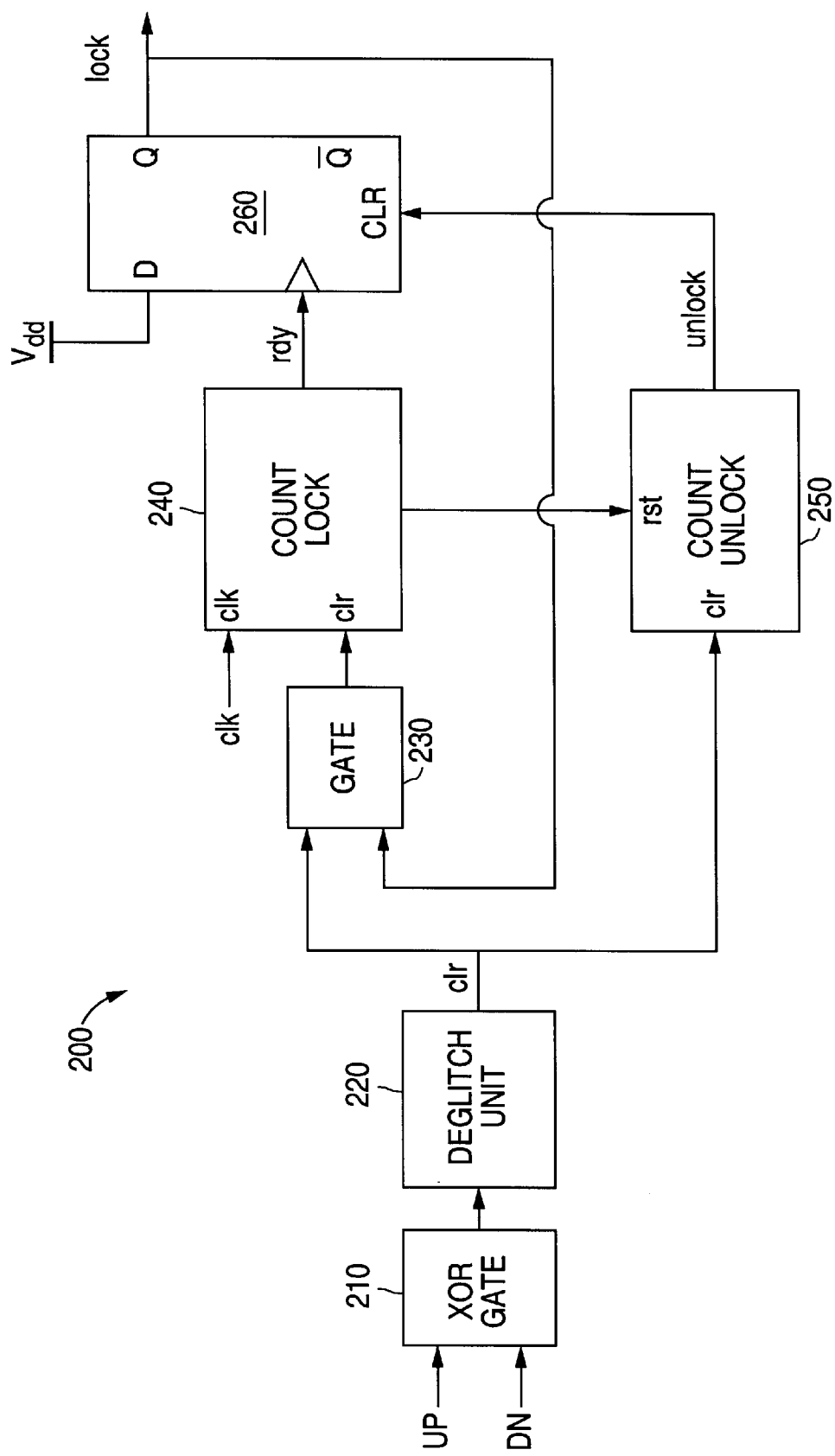
FIG. 2 illustrates a block diagram of an advantageous embodiment of the lock detection circuit of the present invention.

FIG. 2 illustrates a block diagram of an advantageous embodiment of the lock detection circuit 200 of the present invention. Lock detection circuit 200 is coupled to phase frequency detector 120 by signal lines (not shown). Lock detection circuit 200 receives as input the UP output signal and the DN output signal from phase frequency detector 120.

Lock detection circuit 200 generally comprises an exclusive OR gate 210, a deglitch unit 220, a gate circuit 230, a count lock circuit 240, a count unlock circuit 250, and a D flip flop circuit 260.

Figure 3:
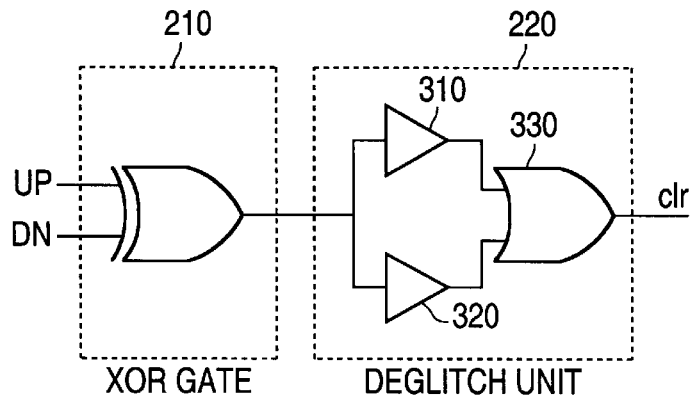
FIG. 3 illustrates a block diagram of an exclusive OR gate and a deglitch unit of the present invention.

FIG. 3 illustrates a more detailed view of exclusive OR gate 210 and deglitch unit 220. As shown in FIG. 2 and in FIG. 3, the UP signal and the DN signal are provided as inputs to exclusive OR gate 210. Exclusive OR gate 210 filters out those portions of an UP signal and those portions of a DN signal that occur at the same time. The output of exclusive OR gate 210 represents either (1) a portion of an UP signal that occurs when a DN signal is not present, or (2) a portion of a DN signal that occurs when an UP signal is not present. The output of exclusive OR gate 210 is coupled to deglitch unit 220.

Deglitch unit 220 comprises buffer 310 and delay buffer 320 coupled in parallel. The output signal from exclusive OR gate 210 is provided to buffer 310 and to delay buffer 320. The time for the signal to travel through delay buffer 320 is greater than the time for the signal to travel through buffer 310. The signal path through delay buffer 320 represents a delayed path. The output of buffer 310 and the output of delay buffer 320 are provided as inputs to OR gate 330. OR gate 330 generates a "clr" signal pulse only when the UP signal and the DN signal are mismatched in time by more than a predetermined period of time. The delay time can be designed to be equal to (or slightly greater than) the estimated "static phase error" of the PLL when it is in a locked condition. The output of deglitch unit 220 is coupled to gate circuit 230 and to count unlock circuit 250.

Figure 4:
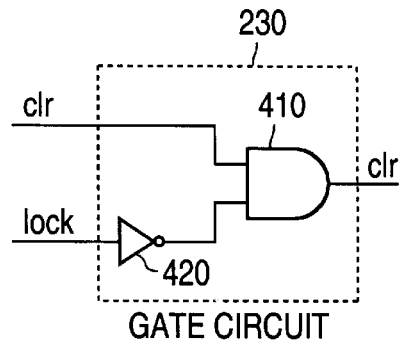
FIG. 4 illustrates a block diagram of a gate circuit of the present invention.

FIG. 4 illustrates a block diagram of a gate circuit 230 of the present invention. Gate circuit 230 comprises AND gate 410 and inverter 420 on one input of AND gate 410. The "clr" signal from deglitch unit 220 is coupled to a first input of AND gate 410. The "lock" signal from D flip flop 260 is coupled to inverter 420. Inverter 420 provides an inverted version of the "lock" signal to a second input of AND gate 410. The output of AND gate 410 is coupled to count lock circuit 240.

The detection of a "locked" or "unlocked" condition in the lock detection circuit 200 of the present invention is made by processing the "dcr" signal pulse. Assume that initially the PLL is not in a locked condition. Then the "lock" signal provided to inverter 420 of gate circuit 230 is low (logic "0"). Inverter 420 provides a high signal (logic "1") to the second input of AND gate 410 of gate circuit 230. Gate circuit 230 receives the "clr" signal pulse (logic "1") from deglitch unit 220 on the first input of AND gate 410. AND gate 410 passes the "clr" signal pulse to count lock circuit 240.

Count lock circuit 240 comprises a counter (sometimes referred to as a "first counter") that resets its state each time a clear signal (i.e., the "clr" signal pulse) is generated. A more detailed view of an advantageous embodiment of count lock circuit 240 is shown in FIG. 5.

The "clk" signal provided to count lock circuit 240 is any low frequency clock in the system. The "clk" signal need not be generated separately for count lock circuit 240. For example, the "clk" signal can be chosen to be the clock at the output of input divider 110 (or, equivalently, the clock at the input of the phase frequency detector 120).

Figure 5:
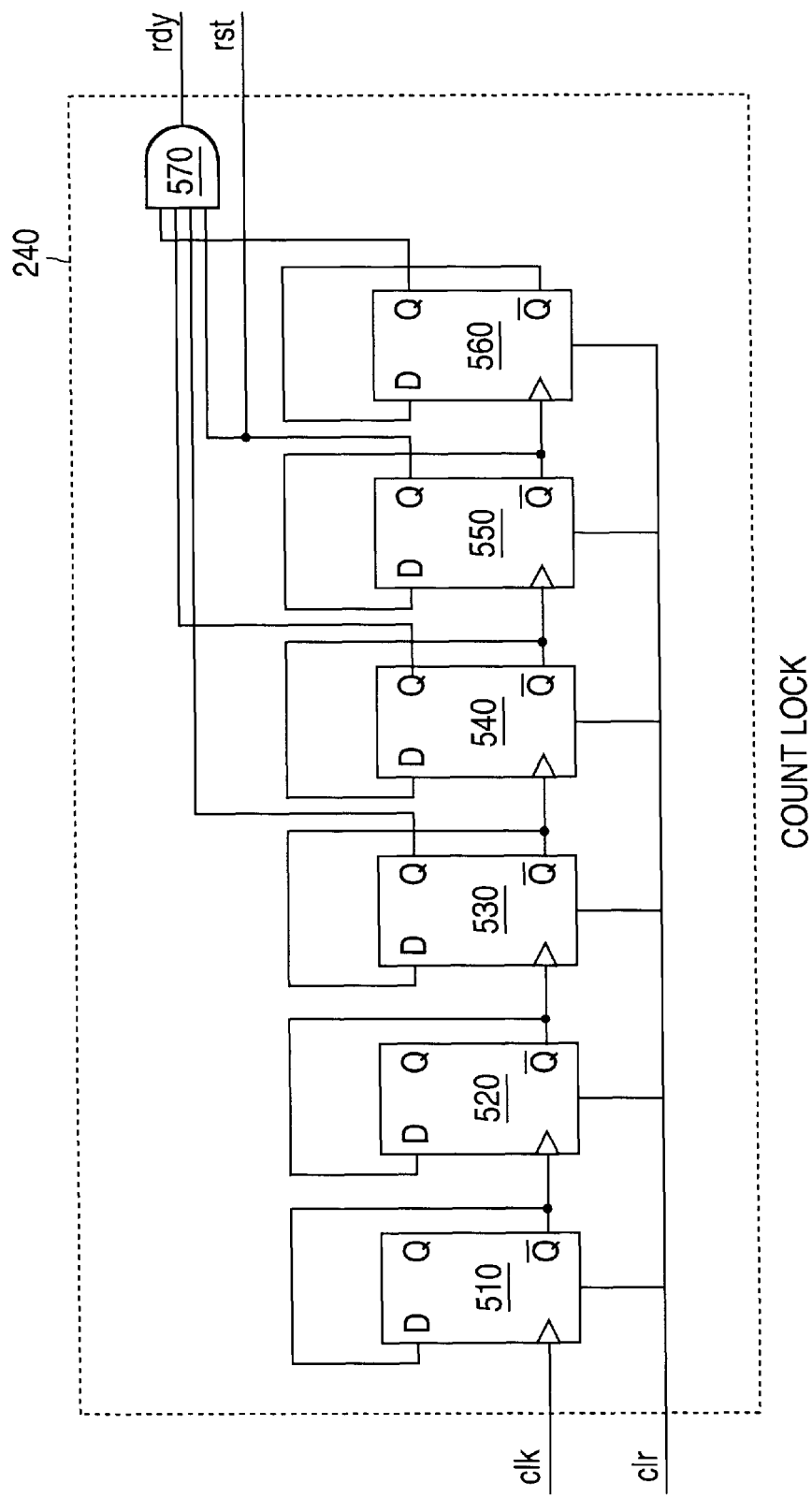
FIG. 5 illustrates a block diagram of an advantageous embodiment of a count lock circuit of the present invention.

Count lock circuit 240 counts the fixed clock signal "clk." In the absence of a clear pulse (i.e., the "clr" signal pulse) for a fixed period of clock cycles, count lock circuit 240 generates an overflow which is the ready signal "rdy." As shown in FIG. 5, in one advantageous embodiment, count lock circuit 240 may comprise a simple "modulo two" counter comprising a series of toggle flip flops circuits. The count lock circuit 240 shown in FIG. 5 comprises six (6) such flip flop circuits, 510 through 560. In this particular embodiment, the Q outputs of flip flop circuits 530, 540, 550, and 560 are coupled to a four input AND gate 570. The output of AND gate 570 provides the ready signal "rdy" when AND gate 570 receives a high signal (logic "1") from each of the flip flop circuits 530, 540, 550 and 560.

The count for count lock circuit 240 shown in FIG. 5 is one hundred twenty (120). Each of the flip flop circuits 510 through 560 divide the input clock by two (2). The output of flip flop circuit 560 will be high (logic "1") after sixty four (64) clock cycles ($2^6$ clock cycles). Similarly, the output of flip flop circuit 550 will be high (logic "1") every thirty two (32) clock cycles ($2^5$ clock cycles), the output of flip flop circuit 540 will be high (logic "1") every sixteen (16) clock cycles ($2^4$ clock cycles), and the output of flip flop circuit 530 will be high (logic "1") every eight (8) clock cycles ($2^3$ clock cycles).

All four of the flip flop circuits 530 through 560 will simultaneously be high (logic "1") after one hundred twenty (120) clock cycles (120=64+32+16+8). Therefore, if a "clr" signal is absent for one hundred twenty (120) clock cycles, then count lock circuit 240 outputs a ready signal "rdy" from AND gate 570.

The count for count lock circuit 240 can be chosen by the latency requirements of the PLL system. It is suggested that for reliable detection of the locked condition of the PLL the count for count lock circuit 240 should be more than sixteen (16). The count of one hundred twenty (120) shown in FIG. 5 is only an example. It is understood that the present invention is not limited to the count of one hundred twenty (120) for count lock circuit 240 shown in FIG. 5.

The ready signal "rdy" is provided to D flip flop circuit 260. The D input of D flip flop circuit 260 is tied to the positive supply voltage $V_{dd}$. The upgoing ready pulse "rdy" signals the locked condition of the PLL. The Q output of D flip flop circuit 260 sets the "lock" signal high (logic "1")

After the PLL is in a locked condition, then lock detection circuit 200 looks for an unlocked condition. In this mode the role of count lock circuit 240 changes. As shown in FIG. 4, gate circuit 230 receives the "lock" signal on the second input of gate circuit 230. The "lock" signal (logic "1") is provided to inverter 420. Inverter 420 provides an inverted "lock" signal (logic "0") to the second input of AND gate 410. AND gate 410 of gate circuit 230 now blocks any "clr" signal pulses that might be generated from resetting the counter in count lock circuit 240.

The counter in count lock circuit 240 now counts the clock signal "clk" and generates a reset signal "rst" after every predetermined number of clock cycles. The count lock circuit 240 shown in FIG. 5 generates a reset signal "rst" every thirty two (32) clock cycles. As shown in FIG. 2, count unlock circuit 250 receives the "clr" signal pulses from deglitch unit 220 on a first input and receives the "rst" signals from count lock circuit 240 on a second input. Count unlock circuit 250 now monitors the number of "clr" signal pulses being generated between two "rst" signal pulses.

Count unlock circuit 250 generates an "unlock" signal when the number of "clr" signal pulses detected exceeds a predetermined amount of pulses between two "rst" signal pulses. Count unlock circuit 250 then provides the "unlock" signal to clear D flip flop circuit 260. This resets the "lock" output of D flip flop circuit 260 to low (logic "0") indicating that the PLL is in an unlocked condition.

Figure 6:
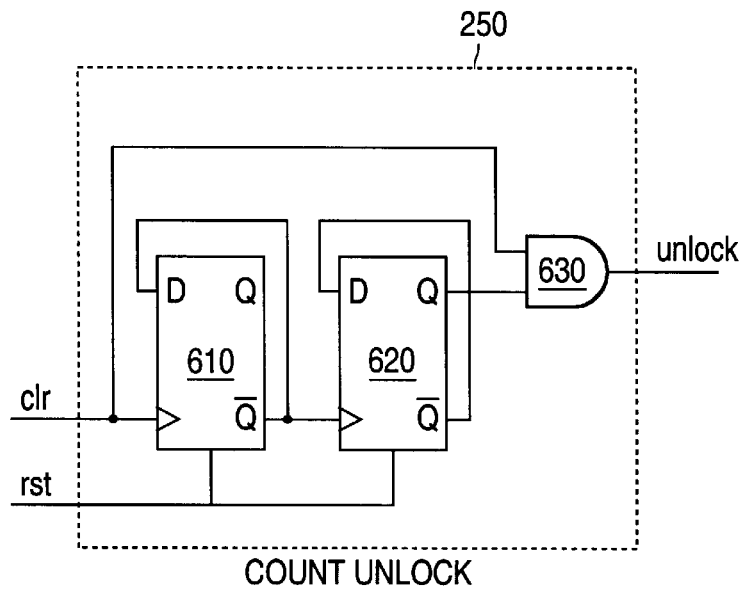
FIG. 6 illustrates a block diagram of an advantageous embodiment of a count unlock circuit of the present invention.

The implementation of count unlock circuit 250 is somewhat similar to the implementation of count lock circuit 240. FIG. 6 illustrates one advantageous embodiment of count unlock circuit 250 comprising a counter (sometimes referred to as a "second counter") The counter in count unlock circuit 250 comprises a simple "modulo two" counter comprising two toggle flip flops circuits, 610 and 620. The Q output of flip flop circuit 620 is provided to a first input of AND gate 630. The "clr" signal pulse is provided to a second input of AND gate 630. The output of AND gate 630 provides the "unlock" signal.

The count unlock circuit 250 shown in FIG. 6 is capable of counting to four (4). The count of four (4) for count unlock circuit 250 is only an example. It is understood that the present invention is not limited to the specific count unlock circuit 250 shown in FIG. 6. Additional flip flop circuits may be added to count unlock circuit 250 to make count unlock circuit capable of counting higher values than four (4).

A periodic reset "rst" signal pulse is needed in count unlock circuit 250 so that the "clr" signal pulses are not accumulated over a long period of time. The count selected for the count unlock circuit 250 and the frequency selected for the "rst" signal may be chosen keeping in mind that the purpose of count unlock circuit 250 is to ignore an occasional "clr" signal pulse (or signal pulses).

Normally a true unlocked condition in a PLL is characterized by a series of subsequent mismatched UP signal pulses and DN signal pulses. In one advantageous embodiment of the present invention, the choice of the count in count lock circuit 240 is sixty four (64) and the choice of the count in count unlock circuit 250 is four (4). Count lock circuit 240 generates the "rst" signal pulse every thirty two (32) clock cycles. Count unlock circuit 250 counts the "clr" signal pulses with respect to a block of thirty two (32) clock cycles. If there are more than four (4) "clr" signal pulses in a block of thirty two (32) clock cycles, then count unlock circuit 250 sets the "unlock" signal high (logic "1"). The "unlock" signal clears the Q output of D flip flop circuit 260 and the "lock" signal goes low (logic "0").

Lock detection circuit 200 operates by cycling back and forth between (1) the mode of searching for the occurrence of an unlocked condition when the PLL is locked and (2) the mode of searching for the occurrence of a locked condition when the PLL is unlocked.

Figure 7:
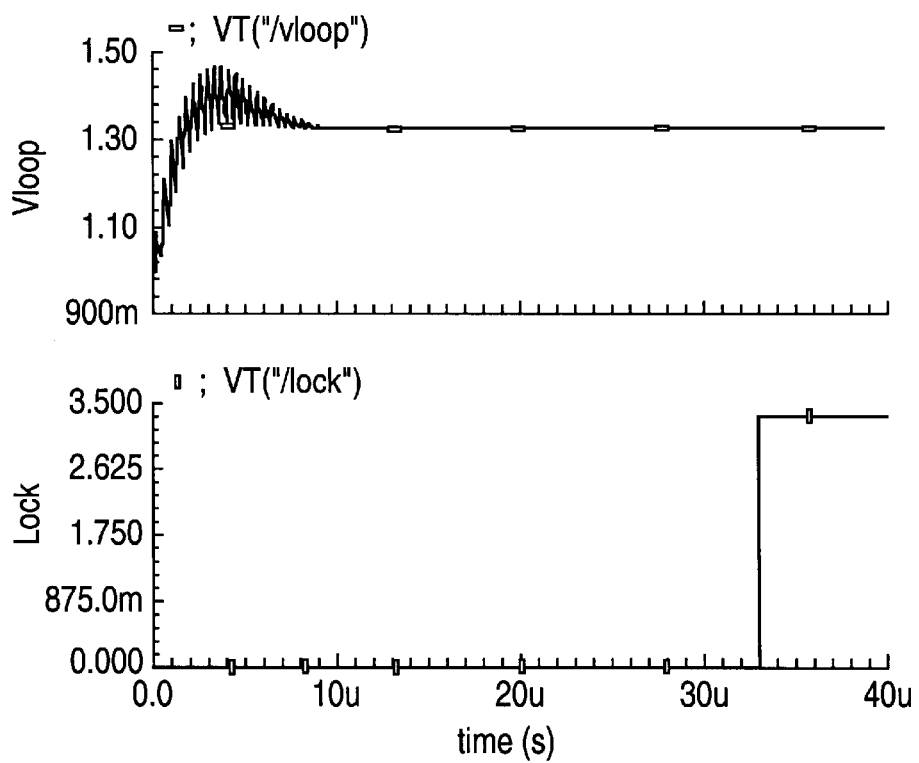
FIG. 7 illustrates a graph of control loop voltage versus time and a graph of a PLL lock detection signal versus time for a simulation of the lock detection circuit of the present invention.

FIG. 7 illustrates a graph of control loop voltage versus time and a graph of a PLL lock signal versus time for a simulation of lock detection circuit 200 of the present invention. Lock detection circuit 200 was simulated using a Spectre simulator. Bsim3v3 models of transistors from a 0.15 micron TSMC process were used in the simulation. The stimuli for the simulated circuit were generated from a C model of the PLL with non-ideal characteristics built in. The output from the C simulation was stored as a PWL file and provided as input to the simulated lock detection circuit as realistic stimuli.

The results of the simulation are shown in FIG. 7. It is noted that the simulated lock detection circuit 200 set the lock detect signal high (logic "1") within approximately thirty three (33) microseconds after the loop voltage increased to a level of 1.30 volts.

Figure 8:
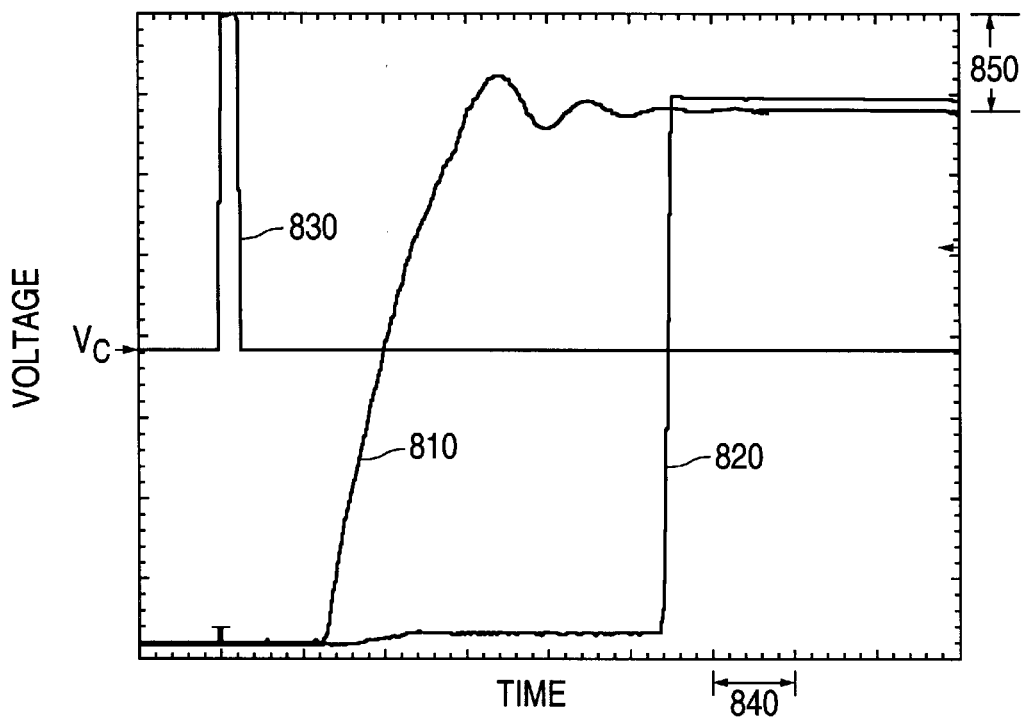
FIG. 8 illustrates a graph of measurements of control loop voltage versus time and a graph of measurements of a PLL lock detection signal versus time from an implementation of the lock detection circuit of the present invention.

FIG. 8 illustrates a graph of measurements of control loop voltage 810 versus time and a graph of measurements of a PLL lock signal 820 versus time from an implementation of the lock detection circuit 200 of the present invention. The lock detection circuit 200 was coupled to a PLL running at speeds up to five hundred megaHertz (500 MHz). The PLL was fabricated using a 0.15 micron TSMC process.

The measurements were taken in an experiment by connecting a frequency shift keying (FSK) source at the input divider 110 with a carrier frequency of ten megaHertz (10 MHz) and a hop frequency of one megahertz (1 MHz) and a frequency shift keying (FSK) rate of one hundred Hertz (100 Hz).

The results of the measurements are shown in FIG. 8. The sync pulse 830 shown in FIG. 8 was used to trigger a digital oscillator. The voltage $V_c$ represents the zero voltage level for sync pulse 830.

FIG. 8 shows the response of control loop voltage 810 and lock signal 820. Each small division along the time scale represents one microsecond. Therefore, the interval 840 represents five microseconds.

Six (6) small divisions equal two hundred fifty millivolts (250 mV) in the voltage scale for control loop voltage 810. Therefore, the interval 850 represents two hundred fifty millivolts (250 mV) for control loop voltage 810.

Six (6) small divisions equals five hundred millivolts (500 mV) in the voltage scale for lock signal 820. Therefore, the interval 850 represents five hundred millivolts (500 mV) for lock signal 820.

The lock signal 820 was observed to reach a value of three and three tenths volts (3.3 volts) within approximately twenty (20) microseconds after the control loop voltage 810 began to increase from a lower level of zero volts (0.0 volts) to an upper level of two volts (2.0 volts).

The above examples and description have been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A lock detection circuit for a phase locked loop circuit, said lock detection circuit comprising:

a first circuit operable to receive an UP signal and a DN signal from a phase frequency detector of said phase locked loop circuit, said first circuit operable to generate a clear "clr" signal that indicates that said UP signal and said DN signal are mismatched in time by more than a predetermined period of time; and a count lock circuit coupled to an output of said first circuit, said count lock circuit operable to receive said clear "clr" signal from said first circuit, and operable to use said clear "clr" signal to determine that said phase locked loop circuit is in a locked condition.

2. A lock detection circuit for a phase locked loop circuit as claimed in claim 1 wherein said count lock circuit comprises a first counter operable to count clock cycles, and wherein said clear "clr" signal is operable to reset a count of said first counter to zero, and wherein said first counter is operable to generate a ready "rdy" signal that indicates that said phase locked loop circuit is in a locked condition when said first counter counts a predetermined number of clock cycles without receiving said clear "clr" signal.

3. A lock detection circuit for a phase locked loop circuit as claimed in claim 2 wherein said predetermined number of clock cycles is one hundred twenty.

4. A lock detection circuit for a phase locked loop circuit as claimed in claim 2 further comprising:

a flip flop circuit coupled to a first output of said count lock circuit, wherein said flip flop circuit is operable to receive said ready "rdy" signal from said first counter of said count lock circuit, and wherein said flip flop circuit is operable to output a "lock" signal on an output of said flip flop circuit that indicates that said phase locked loop circuit is in a locked condition.

5. A lock detection circuit for a phase locked loop circuit as claimed in claim 1 wherein said first circuit comprises:

an exclusive OR circuit operable to receive an UP signal on a first input and operable to receive a DN signal on a second input; and a deglitch unit coupled to an output of said exclusive OR circuit, said deglitch unit operable to generate said clear "clr" signal that indicates that an UP signal and a DN signal are mismatched in time by more than a predetermined period of time.

6. A lock detection circuit for a phase locked loop circuit as claimed in claim 5 wherein said predetermined period of time is approximately equal to an estimated static phase error when said phase locked loop circuit is locked.

7. A lock detection circuit for a phase locked loop circuit as claimed in claim 1 further comprising:

a count unlock circuit coupled to an output of said first circuit and coupled to a second output of said count lock circuit, said count unlock circuit operable to receive said clear "clr" signal from said first circuit, and operable to use said clear "clr" signal to determine that said phase locked loop circuit is in an unlocked condition.

8. A lock detection circuit for a phase locked loop circuit as claimed in claim 4 wherein said first counter of said count lock circuit is operable to generate a reset "rst" signal that indicates that said first counter has counted a predetermined number of clock cycles.

9. A lock detection circuit for a phase locked loop circuit as claimed in claim 8 wherein said predetermined number of clock cycles is thirty two.

10. A lock detection circuit for a phase locked loop circuit as claimed in claim 8 further comprising:

a gate circuit having a first input coupled to an output of said first circuit and having a second input coupled to said output of said flip flop circuit that outputs said "lock" signal, and said gate circuit having an output coupled to an input of said count lock circuit;

said gate circuit operable to prevent said clear "clr" signal from said first circuit from resetting said first counter of said count lock circuit when said gate circuit receives said "lock" signal on said second input of said gate circuit.

11. A lock detection circuit for a phase locked loop circuit as claimed in claim 10 further comprising:

a count unlock circuit coupled to an output of said first circuit and coupled to a second output of said count lock circuit, said count unlock circuit operable to receive said clear "cir" signal from said first circuit, and operable to receive said reset "rst" signal from said count lock circuit, and operable to use said clear "cdr" signal and said reset "rst" signal to determine that said phase locked loop circuit is in an unlocked condition.

12. A lock detection circuit for a phase locked loop circuit as claimed in claim 11 wherein said count unlock circuit comprises:

a second counter operable to count clear "clr" signals from said first circuit, and wherein a reset "rst" signal from said count lock circuit is operable to reset a count of said second counter to zero, and wherein said second counter is operable to generate an "unlock" signal that indicates that said phase locked loop circuit is in an unlocked condition when said second counter counts a predetermined number of clear "clr" signals from said first circuit during a time period between two reset "rst" signals from said count lock circuit.

13. A lock detection circuit for a phase locked loop circuit as claimed in claim 12 wherein said predetermined number of clear "clr" signals is four; and wherein said time period between two reset "rst" signals is thirty two clock cycles.

14. A lock detection circuit for a phase locked loop circuit as claimed in claim 12 wherein said second counter of said unlock circuit receives reset "rst" signals from said count lock circuit when said gate circuit is receiving said "lock" signal on said second input of said gate circuit.

15. A lock detection circuit for a phase locked loop circuit as claimed in claim 12 wherein said "unlock" signal generated by said count unlock circuit is provided to a clear input of said flip flop circuit to cause said flip flop circuit to output an "unlock" signal on an output of said flip flop circuit that indicates that said phase locked loop circuit is in an unlocked condition.

16. A method for detecting a lock condition in a phase locked loop circuit, said method comprising the steps of:

receiving an UP signal and a DN signal from a phase frequency detector of said phase locked loop circuit in a first circuit;

generating in said first circuit a clear "clr" signal that indicates that said UP signal and said DN signal are mismatched in time by more than a predetermined period of time;

receiving said clear "clr" signal from said first circuit in a count lock circuit coupled to an output of said first circuit; and using said clear "cdr" signal in said count lock circuit to determine that said phase locked loop circuit is in a locked condition.

17. A method as claimed in claim 16 further comprising the steps of:

counting clock cycles in a first counter of said count lock circuit;

resetting a count of said first counter to zero when said first counter receives said clear "cdr" signal from said first counter;

counting in said first counter a predetermined number of clock cycles without receiving said clear "clr" signal; and generating a ready "rdy" signal in said first counter that indicates that said phase locked loop circuit is in a locked condition when said first counter counts said predetermined number of clock cycles without receiving said clear "clr" signal.

18. A method as claimed in claim 17 wherein said predetermined number of clock cycles is one hundred twenty.

19. A method as claimed in claim 17 further comprising the steps of:

coupling a flip flop circuit to a first input of said count lock circuit;

receiving within said flip flop circuit said ready "rdy" signal from said first counter of said count lock circuit; and outputting a "lock" signal on an output of said flip flop circuit that indicates that said phase locked loop circuit is in a locked condition.

20. A method as claimed in claim 16 further comprising the steps of:

receiving an UP signal on a first input of an exclusive OR circuit of said first circuit;

receiving a DN signal on a second input of said exclusive OR circuit of said first circuit;

receiving an output of said exclusive OR circuit in a deglitch unit coupled to an output of said exclusive OR circuit; and generating in said deglitch unit said clear "clr" signal that indicates that an UP signal and a DN signal are mismatched in time by more than a predetermined period of time.

21. A method as claimed in claim 20 wherein said predetermined period of time is approximately equal to an estimated static phase error when said phase locked loop circuit is locked.

22. A method as claimed in claim 16 further comprising the steps of coupling a count unlock circuit to an output of said first circuit;

coupling said count unlock circuit to a second output of said count lock circuit;

receiving in said count unlock circuit said clear "clr" signal from said first circuit; and using said "clr" signal in said count unlock circuit to determine that said phase locked loop circuit is in an unlocked condition.

23. A method as claimed in claim 19 further comprising the step of:

generating in said first counter of said count lock circuit a reset "rst" signal that indicates that said first counter has counted a predetermined number of clock cycles.

24. A method as claimed in claim 23 wherein said predetermined number of clock cycles is thirty two.

25. A method as claimed in claim 23 further comprising the steps of:

coupling a first input of a gate circuit to an output of said first circuit;

coupling a second input of said gate circuit to said output of said flip flop circuit that outputs said "lock" signal;

coupling an output of said gate circuit to an input of said count lock circuit; and preventing said clear "cir" signal from said first circuit from resetting said first counter of said count lock circuit when said gate circuit receives said "lock" signal on said second input of said gate circuit.

26. A method as claimed in claim 25 further comprising the steps of:

coupling a count unlock circuit to an output of said first circuit;

coupling said count unlock circuit to a second output of said count lock circuit;

receiving in said count unlock circuit said clear "clr" signal from said first circuit;

receiving in said count unlock circuit said reset "rst" signal from said count lock circuit; and using said clear "clr" signal and said reset "rst" signal in said count unlock circuit to determine that said phase locked loop circuit is in an unlocked condition.

27. A method as claimed in claim 26 further comprising the steps of:

counting clear "clr" signals from said first circuit in a second counter within said count unlock circuit;

resetting a count of said second counter to zero when said reset "rst" signal from said count lock circuit is received in said second counter of said count unlock circuit;

generating an "unlock" signal in said second counter that indicates that said phase locked loop circuit is in an unlocked condition when said second counter counts a predetermined number of clear "clr" signals from said first circuit during a time period between two reset "rst" signals from said count lock circuit.

28. A method as claimed in claim 27 wherein said predetermined number of clear "clr" signals is four; and wherein said time period between two reset "rst" signals is thirty two clock cycles.

29. A method as claimed in claim 27 further comprising the step of:

receiving in said second counter of said unlock circuit reset "rst" signals from said count lock circuit when said gate circuit is receiving said "lock" signal on said second input of said gate circuit.

30. A method as claimed in claim 27 further comprising the steps of:

providing said "unlock" signal generated by said count unlock circuit to a clear input of said flip flop circuit; and causing said flip flop circuit to output an "unlock" signal on an output of said flip flop circuit that indicates that said phase locked loop circuit is in an unlocked condition.

* * * * *

UNITED STATES PATENT AND TRADEMARK OFFICE
CERTIFICATE OF CORRECTION

PATENT NO. : 6,762,631 B1
DATED : July 13, 2004
INVENTOR(S) : Ravi Kumar

It is certified that error appears in the above-identified patent and that said Letters Patent is hereby corrected as shown below:

<u>Column 1,</u>
Line 9, delete "09/992,000" and replace with -- 09/992,500 --;
Line 33, delete "FIN" and insert -- $F_{IN}$ --;
Line 47, delete "For" and insert -- $F_{OUT}$ --;

<u>Column 3,</u>
Line 31, delete "dclr" and insert -- clr --;

<u>Column 10,</u>
Line 26, delete "cdr" and insert -- clr --.

Signed and Sealed this

Sixth Day of June, 2006

JON W. DUDAS
*Director of the United States Patent and Trademark Office*